United States Patent [19]
Keeth et al.

[11] Patent Number: 5,935,263
[45] Date of Patent: Aug. 10, 1999

[54] METHOD AND APPARATUS FOR MEMORY ARRAY COMPRESSED DATA TESTING

[75] Inventors: Brent Keeth, Boise; Troy A. Manning, Meridian; Chris G. Martin, Boise; Kim M. Pierce, Meridian; Wallace E. Fister, Boise; Kevin J. Ryan, Eagle; Terry R. Lee, Boise; Mike Pearson, Boise; Thomas W. Voshell, Boise, all of Id.

[73] Assignee: Micron Technology, Inc., Boise, Id.

[21] Appl. No.: 08/886,195

[22] Filed: Jul. 1, 1997

[51] Int. Cl.⁶ ........................................... G06F 11/00
[52] U.S. Cl. ............................................. 714/718
[58] Field of Search ................. 371/21.1, 21.2, 371/21.4, 21.6; 365/189.05, 190, 208; 324/158 R

[56] References Cited

U.S. PATENT DOCUMENTS

| | | | |
|---|---|---|---|
| 5,029,330 | 7/1991 | Kajigaya | 365/201 |
| 5,268,639 | 12/1993 | Gasbarro et al. | 324/158 R |
| 5,289,415 | 2/1994 | DiMarco et al. | 365/190 |
| 5,305,272 | 4/1994 | Matsuo et al. | 365/208 |
| 5,451,898 | 9/1995 | Johnson | 327/563 |
| 5,488,321 | 1/1996 | Johnson | 327/66 |
| 5,519,661 | 5/1996 | Miura | 365/205 |
| 5,621,340 | 4/1997 | Lee et al. | 327/65 |
| 5,684,750 | 11/1997 | Kondoh et al. | 365/205 |
| 5,708,607 | 1/1998 | Lee et al. | 365/189.05 |
| 5,809,038 | 9/1998 | Martin | 371/21.2 |

FOREIGN PATENT DOCUMENTS

| | | | |
|---|---|---|---|
| 0 283 906 A1 | 9/1988 | European Pat. Off. | G11C 29/00 |
| 0 828 252 A2 | 3/1998 | European Pat. Off. | G11C 7/06 |
| 0 840 328 A2 | 6/1998 | European Pat. Off. | G11C 29/00 |

OTHER PUBLICATIONS

Ishibashi, K. et al, "A 6–ns 4–Mb CMOS SRAM with Offset–Voltage–Insensitive Current Sense Amplifiers," IEEE Journal of Solid–State Circuits, vol. 30, No. 4, Apr. 1995, pp. 728–733.

Kuroda, T. et al., "Automated Bias Control (ABC) Circuit for High–Performance VLSI's," IEEE Journal of Solid–State Circuits, vol. 27, No. 4, Apr. 1992, pp. 539–545.

Taguchi, M. et al., "A 40–ns 64–Mb DRAM with 64–b Parallel Data Bus Architecture," IEEE Journal of Solid–State Circuits, vol. 26, No. 11, Nov. 1991, pp. 1493–1497.

Taguchi M. et al., A 40ns 64Mb DRAM with Current–Sensing Data–Bus Amplifier, ISSCC Digest of Technical Papers, 1991, TAM 6.5.

Takeshi, N. et al., "A 17–ns 4–Mb CMOS DRAM," IEEE Journal of Solid State Circuits, vol. 26, No. 11, Nov. 1991, pp. 1538–1543.

Descriptive literature entitled, "400 MHz SLDRAM, 4M x 16SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEEComputer Society, Copyright 1996 by the Institute of Electrical and Electronics Engineers, Inc., New York, NY, pp. 1–56.

*Primary Examiner*—Vincent P. Canney
*Attorney, Agent, or Firm*—Seed and Berry LLP

[57] ABSTRACT

A memory device includes an output data path that transfers data from an I/O circuit coupled to a memory array to an output tri-state buffer. A comparing circuit compares data from the I/O circuit to a desired data pattern. If the data does not match the desired pattern, the comparing circuit outputs an error signal that is input to the output buffer. When the output buffer receives the error signal, the output buffer is disabled and outputs a tri-state condition on a data bus. Since the error signal corresponds to more than one data bit, the tri-state condition of the output buffer is held for more than one tick of the data clock, rather than only a single tick. Consequently, the tri-state condition remains on the bus for sufficiently long that a test system can detect the tri-state condition even at very high clock frequencies.

36 Claims, 6 Drawing Sheets

METHOD AND APPARATUS FOR MEMORY ARRAY COMPRESSED DATA TESTING

TECHNICAL FIELD

The present invention relates to integrated memory devices and more particularly to data transfer and testing in memory devices.

BACKGROUND OF THE INVENTION

Conventional computer systems include a processor coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of the computer system, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at frequency that is a substantially lower than the clock frequency of the processor. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives, floppy disk drives, tape cassettes, and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–care coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines which have been omitted from FIG. 1 in the interests of brevity. For example, as explained below, the memory devices 16a–c also receive a master clock signal CKEXT to provide internal timing signals, a data clock signal DCLK clocking data into or out of the memory device 16, and a FLAG signal signifying the start of a command packet.

One of the memory devices 16a is shown in block diagram form in FIG. 2. The memory device 16a includes a clock divider and delay circuit 40 that receives a master clock signal CKEXT and generates an internal clock signal CKINT and a large number of other clock and timing signals to control the timing of various operations in the memory device 16. The memory device 16 also includes a command buffer 46 and an address capture circuit 48 which receive an internal clock signal CKINT, a command packet CA0–CA9 on a 10-bit command bus 50, and a FLAG signal on line 52. As explained above, the command packet contains control and address information for each memory transfer, and the FLAG signal identifies the start of a command packet which may include more than one 10-bit packet word. In fact, a command packet is generally in the form of a sequence of 10-bit packet words on the 10-bit command bus 50. Each of the 10-bit packet words is received on a respective clock edge (rising or falling) of the master clock CKEXT. Thus, a 40-bit packet is typically received at four clock edges, i.e., over two cycles of the master clock CKEXT.

The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides a command word to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command packet. The address is provided to an address sequencer 64 which generates a corresponding 3-bit bank address on bus 66, a 10-bit row address on bus 68, and a 7-bit column address on bus 71. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed.

Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88 as determined by a multiplexer 90. However, only one of the row latch/decoder/drivers 82a–h is active at any one time as determined by bank control logic 94 as a function of a bank address from a bank address register 96.

Each of the memory banks 80a–80h also receives a column address through a column address path 75 that includes a redundant column circuit 71. The redundant column circuit 71 determines if the column address corresponds to a defective address and outputs either the column address or a redundant column address to a column latch/decoder 100. The column latch/decoder supplies I/O gating signals to an I/O gating circuit 102 that interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a bank of DC sense amplifiers 103 and a read latch 120 that amplify and store data from the I/O gating circuit 102. In the memory device 16a shown in FIG. 2, 64 bits of data are stored in the read latch 120. The read latch then provides four 16-bit data words to an output multiplexer 122 that sequentially supplies each of the 16-bit data words to a four stage read FIFO buffer 124. Successive 16-bit data words are clocked through the read FIFO buffer 124 by a clock signal RCLK generated from the internal clock CKINT by a programmable delay circuit 126. The read FIFO buffer 124 sequentially applies the 16-bit words to a driver circuit 128 which, in turn, applies the 16-bit data words to a data bus 130 forming part of the processor bus 14.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144 responsive to the data clock DCLK. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

To test the memory devices 16a–16h, data are written to each of the banks 80a–80h in a selected pattern. The data are then read from the banks 80a–80h and output on the data bus 49. The read data are then compared to the selected pattern. If any of the read data do not match the selected pattern, a defective row or column is identified. The defect can then be repaired by substituting a redundant row or column for the defective row or column. Such testing can be very time intensive, even at relatively high speeds. There is therefore a need for a more rapid approach to testing such memory devices 16a–16h.

During testing of the memory device 16a, data are written to the memory banks 80a–80h in a selected test pattern. Data are then read from the memory banks 80a–80h and compared to the selected test pattern. If data read from a location in the banks 80a–80h does not match the data written to the location, the driver circuit 128 is driven to a tri-state condition. In the tri-state condition, the driver circuit 128 presents a high impedance, floating output to the data bus 130. A test head 111 indicates the tri-state condition to test circuitry 113 that identify the erroneous data. A redundant row or column can then replace the row or column having the defective location.

Because the memory device 40 is operated and tested at high speeds, the time during which the tri-state condition is present on the data bus 49 can be very short. At very high frequencies, capacitance and inductance of the data bus 49 and the test head 110 can make the tri-state condition very difficult to detect.

SUMMARY OF THE INVENTION

An I/O circuit in a memory device reads data from a memory array and a comparing circuit compares the data to a desired pattern. If the read data is incorrect, the comparing circuit disables a tri-state output buffer and the tri-state output buffer produces an error indicator in response. The comparing circuit disables the output buffer for a plurality of clock transitions so that the tri-state indicator is present for a sufficiently long period for a test system to detect the tri-state indicator.

In one embodiment, data from the memory array is read by sense amplifiers. The data are compressed by multiplexers in response to selected bits of an address signal to produce 64 bits of data. The 64 bits of data are applied to line drivers that output data to a set of output registers.

Data from the output registers is compared by the comparing circuit to a selected set of data. If the data do not match the selected set of data, the output buffer is disabled. If the data match the selected set of data the output buffer is enabled. The data from the registers are then clocked serially into the output buffer over a plurality of clock transitions. If the output buffer is disabled, the data do not affect the buffer output and a test head detects a tri-state condition. If the output is enabled, the test head receives the data from the registers.

DETAILED DESCRIPTION OF THE INVENTION

Figure 1:
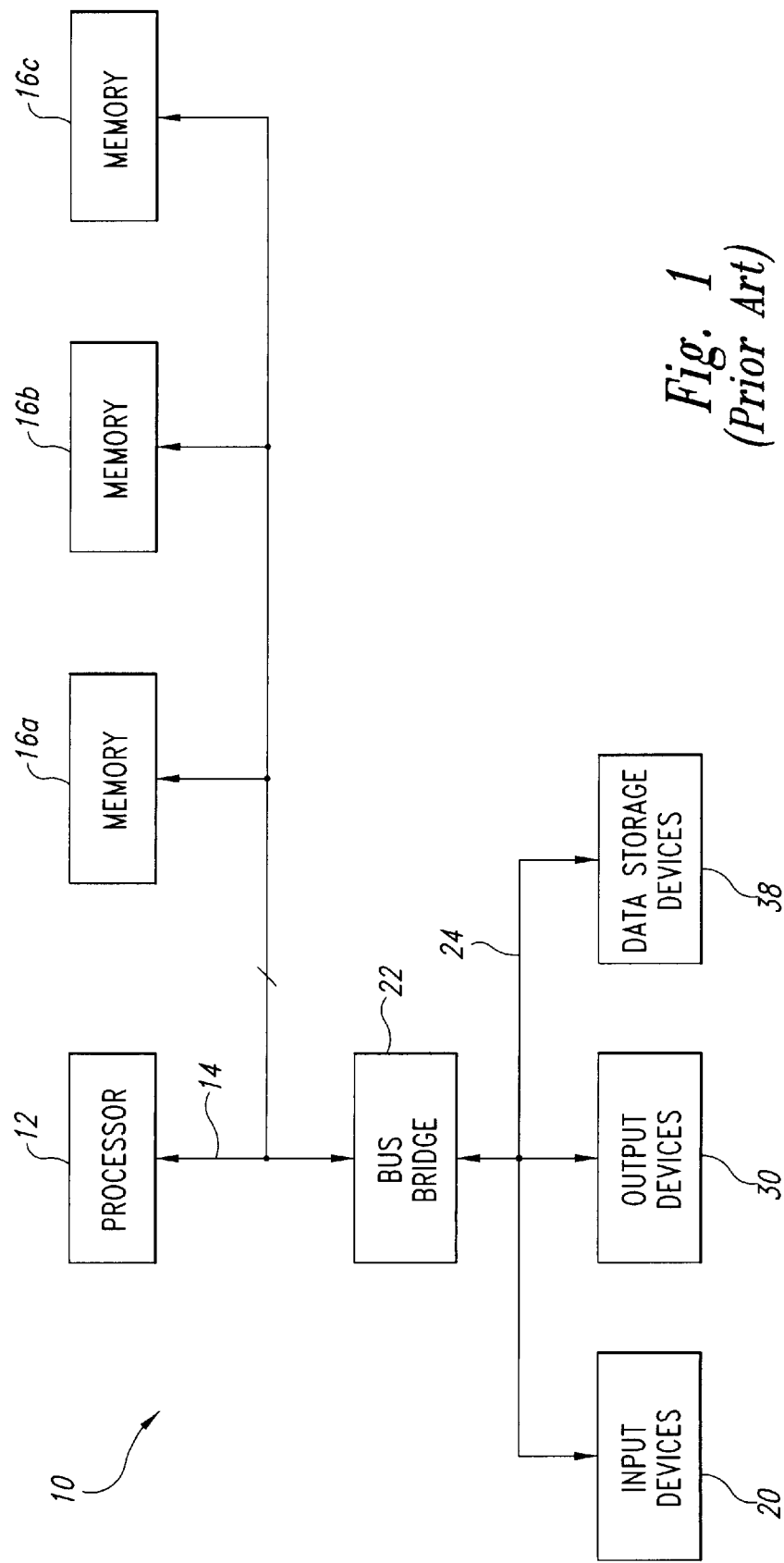
FIG. 1 is a block diagram of a computer system using SyncLink architecture.
Figure 2:
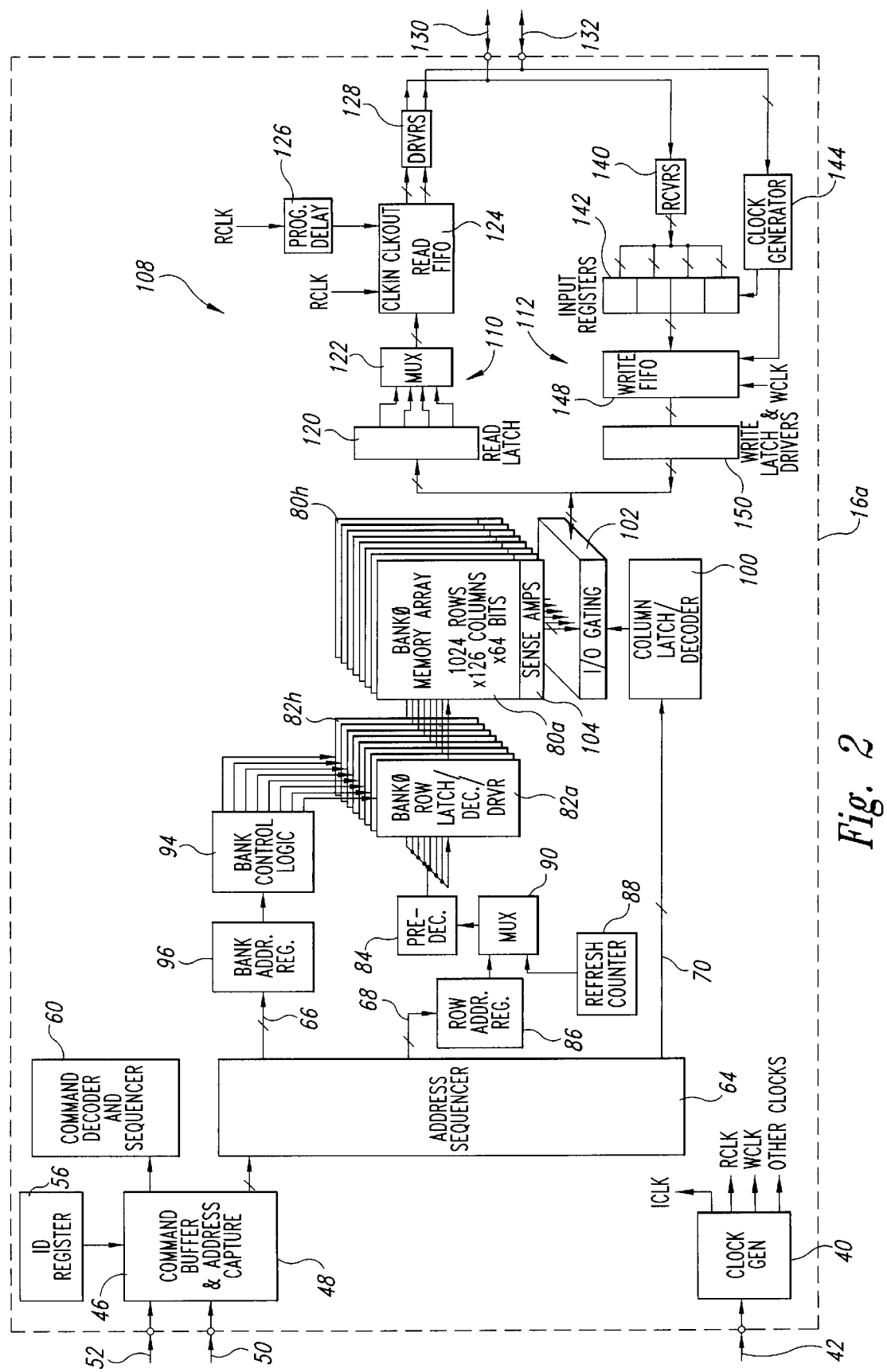
FIG. 2 is a block diagram of a packetized DRAM used in the computer system of FIG. 1.
Figure 3:
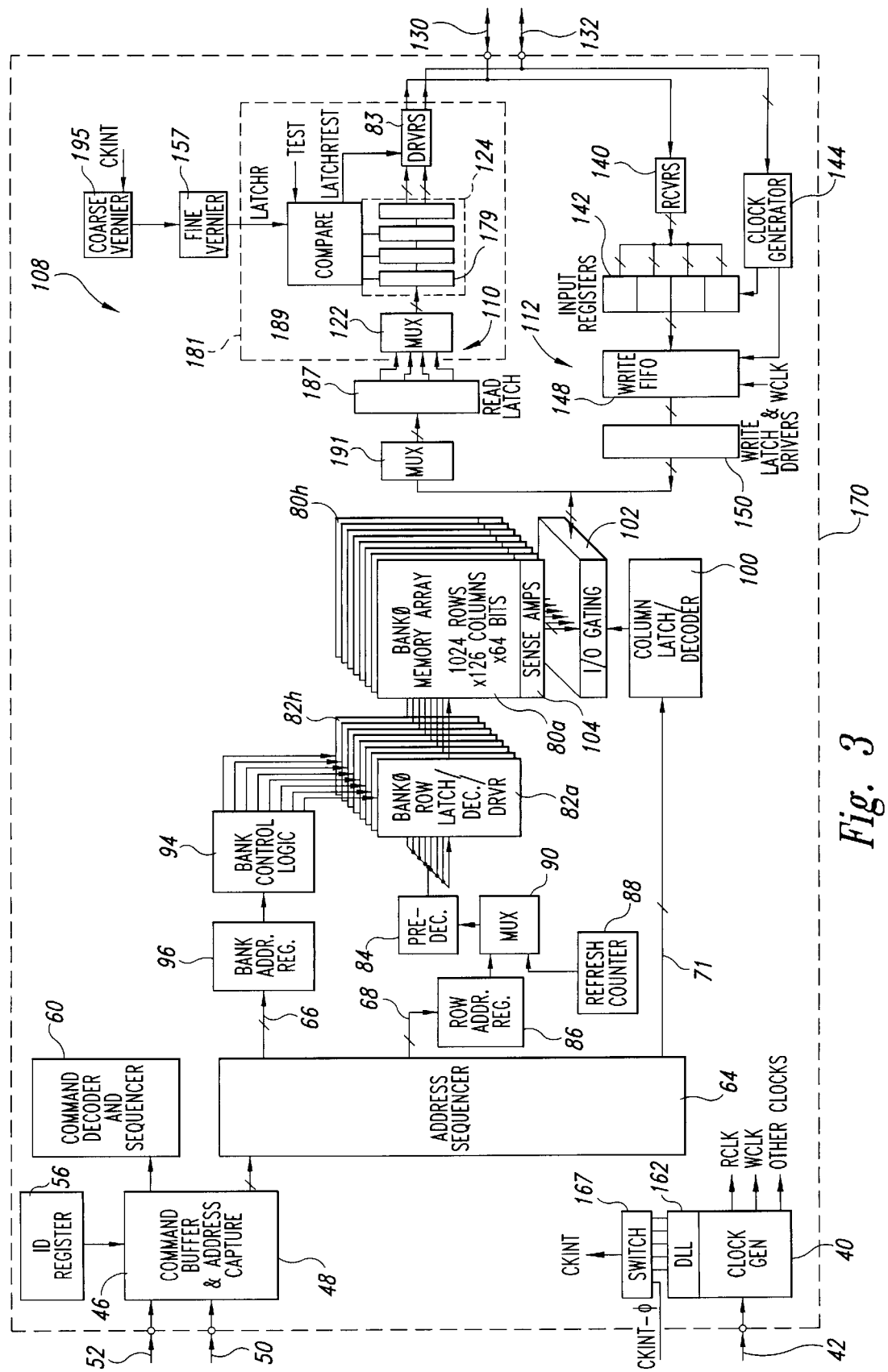
FIG. 3 is a block diagram of a memory device according to the invention including a compare circuit linked to an I/O gating circuit.

FIG. 3 shows a packetized memory device 170 that may be used in the computer system of FIG. 1. The memory device 170 includes several of the same components as the memory device 16 of FIG. 2, such as the memory banks 80a–80h, where common elements are numbered identically. Like the embodiment of FIG. 1, the processor 12 controls the memory device 170 through command packets COM and the external clock signal CKEXT. The memory device 170 also receives data over the 16-bit data bus 130, synchronously with the data clock signal DCLK.

During typical operation, data are written to and read from the memory banks 80a–80h in substantially the same fashion as described above for the memory device 16 of FIG. 2. However, the read data path 110 differs from the read data path 110 of FIG. 2 in the inclusion of 16 comparing circuits 189 that allow a different approach to testing of the memory device 170. During typical operation, the comparing circuits 189 are disabled and do not affect operation of the read FIFO buffer 124 or the driver circuit 128.

Although the read data path 110 is presented as including the read FIFO buffer 124 with four stages of output registers 179, a variety of other data path structures may be utilized in accordance with the invention. For example, the memory device 170 could include input and output data sequencers that employ a plurality of registers to stagger transfers of data DA between the data bus 130 and the I/O gating circuit 102. Control of timing in such data sequencers is described in U.S. patent application Ser. No. 08/833,376, filed Apr. 4, 1997, of Manning which is commonly assigned herewith and which is incorporated herein by reference.

To establish synchronization of the internal and external timing, the clock generator 126 produces several phase-shifted clock signals CKINT-$\phi_X$ at respective taps of a delay-locked loop 162 responsive to the external clock signal CKEXT. Each of the phase-shifted clock signals CKINT-$\phi_X$ has a respective phase-shift $\phi_X$ relative to the external clock signal CKEXT. In response to commands COM, the buffer 46 activates a switching circuit 163 to select one of the phase-shifted clock signals CKINT-$\phi_1$ as a principal internal clock signal CKINT. The selected phase-shifted clock signal CKINT-$\phi_1$ has a phase-shift $\phi_1$ corresponding to delays within the memory device 170 and propagation delays of the external clock signal CKEXT. Because the shifted internal clock signal CKINT-$\phi_1$ is synchronized to the external clock signal CKEXT, operations within the memory device 170 can be synchronized to commands and data arriving at the memory device 170.

Figure 4:
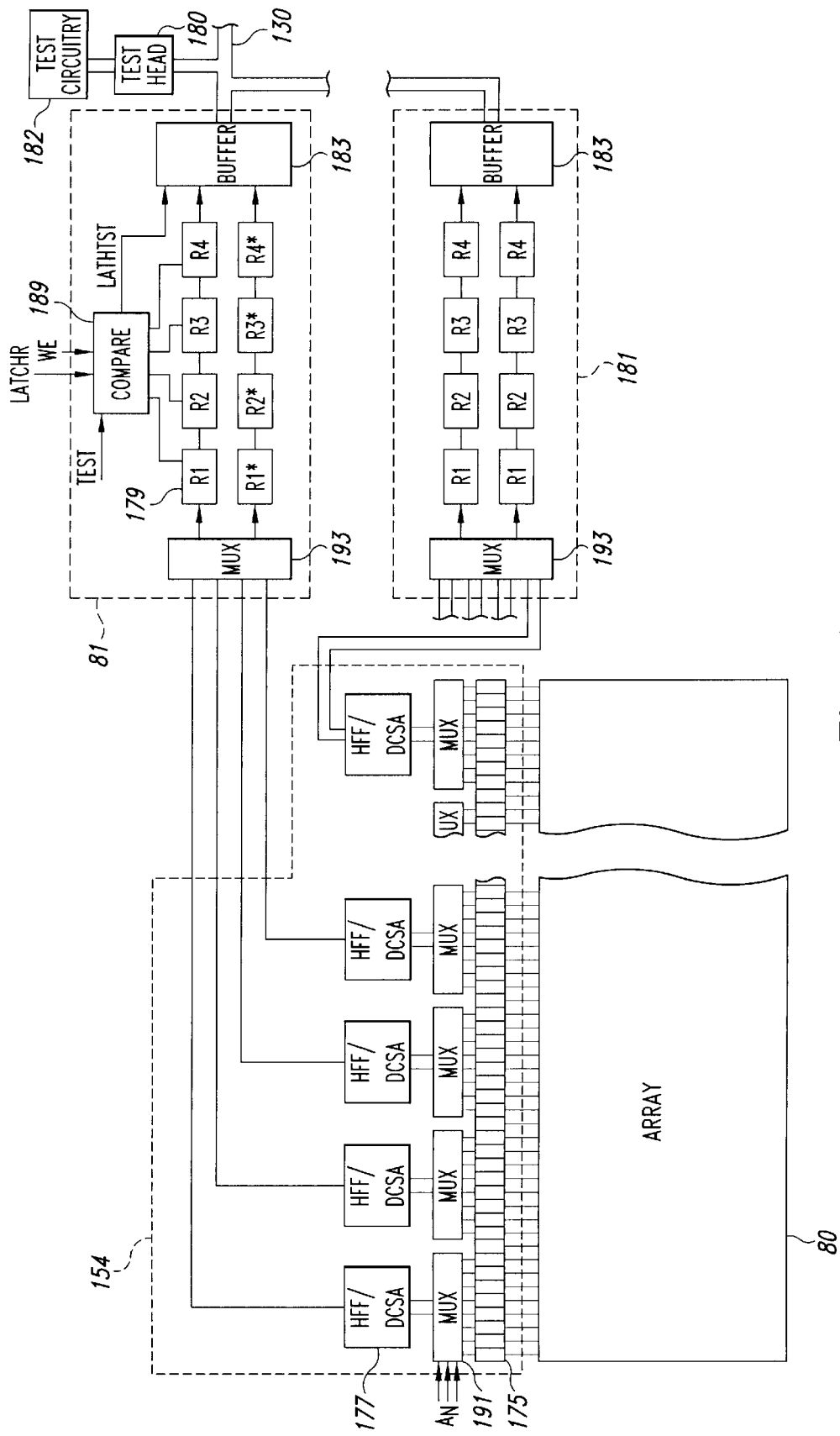
FIG. 4 is a schematic of an array, I/O gating circuit, and an output data path in the memory device of FIG. 3 where a comparator is coupled to a set of output registers.

For reading data from the memory device 170, the I/O gating circuit 154, shown in greater detail in FIG. 4, under control of the command sequencer and decoder 60 prefetches 64 bits of data from one of the memory banks 80a–80h and transfers the prefetched data to an output circuit 181 responsive to the internal clock signal CKINT. The I/O gating circuit 154 includes a set of sense amplifiers 175 for each digit line pair. For example, an array having 512 digit line pairs would include 512 sense amplifiers 175 that read data from the digit lines and provide complementary output data in response. A set of multiplexers 191 receive the data from the sense amplifiers 175 and, responsive to a control signal from the buffer 46, output the 64 bits of data. For the example described above of a 512 column array, the multiplexers 191 would be 8-to-1 multiplexers so that each multiplexer 191 would output data from one of 8 digit line pairs.

The output data from each multiplexer 191 in the multiplexer bank are then applied to a line driver 177, which is typically formed from a DC sense amplifier or helper flip-flop. The line driver 177 converts the low drive current signals from the sense amplifiers 175 and multiplexer 191 to corresponding signals with higher current capability. The line drivers 177 output the data to a corresponding output circuit 181 where the data are received by a second bank of multiplexers 193. The second bank of multiplexers 193 multiplexes the 64 bits by a factor of four to provide four sets of 16 bits that are input to a series of four pairs of 16-bit output registers 179. Since there are complementary data signals for each bit, each bit utilizes two registers (a bit register and a complementary bit register). As best seen in FIG. 2, for each complementary line pair, the output circuit 181 includes eight output registers that receive the data responsive to the internal clock signal CKINT. The data in the eight output registers are latched into a tri-state output buffer 183 by a read latch signal LATCHR from an output vernier 157.

The read latch signal LATCHR is a pulsed signal that is produced responsive to a selected edge of the internal clock signal CKINT. The edge is selected by a coarse vernier 195 within the clock generator 126 responsive to a coarse adjust signal ADJ_C from the buffer 46. In response to the read latch signal LATCHR, each tri-state output buffer 183 outputs four bits of output data to respective lines of the 16 line data bus 149. The read latch signal LATCHR has a frequency twice that of the internal clock signal CKINT because the pulses of the read latch signal LATCHR are produced by an output vernier 157 responsive to both rising and falling edges of the internal clock signal CKINT. Thus, four bits of data are transferred from the eight output registers 179 to the data bus 130 over a period about equal to two cycles of the internal clock signal CKINT.

During testing, the read data are evaluated by the comparing circuits 189, before any data are output, as will now be described. For testing the device 170, the comparing circuits 189 are enabled by a test signal TEST from the buffer 46. After the series of four registers 179 are filled and before any of the data are output to the data bus 130, the respective comparing circuit 189 compares the 4 bits of data from its respective series of four registers 179 to a specified bit pattern or to each other to see if any of the data are incorrect. For example, if the specified bit pattern is "1111," the comparing circuit 189 determines that the data are defective if any of the bits is "0." One skilled in the art will recognize that the comparison function of the comparing circuits 189 can be implemented with a variety of circuit structures. For example, where the desired bit pattern is "1111" the comparing circuit 189 may use a 4-input NAND gate to verify that all of the bits are "1s." Where the bits are compared to each other, the comparing circuit 189 may be formed from NAND gates and NOR gates in a variety of circuit structures.

In addition to monitoring the data in the registers 179, the comparing circuit 189 also monitors command signals from the sequencer and decoder 60, such as a write enable signal WE, to determine if reading is disabled. In response to its detection of a non-reading mode or detection of an incorrect data pattern, the comparing circuit 189 outputs a flag signal FLAG to the output driver 183. Because the comparing circuit 189 monitors the data in all four registers 179, a single flag signal FLAG can correspond to four bits of data. Thus, for each set of 4 bits of data, the flag signal FLAG indicates if any one of the 4 bits is erroneous.

The flag signal FLAG from the comparing circuit 189 is applied to an enable input of the respective tri-state output buffer 183. If the flag signal FLAG is true, the tri-state output buffer 183 is disabled and provides an error indication to the data bus 130. The error indication is a tri-state output, i.e., a floating, high impedance.

A test head 180 (FIG. 3) monitors the data bus 130, and responsive to the tri-state output, registers the data as invalid. Additional test circuitry 182 receives the information from the test head 180 and indicates that the corresponding four columns include a defective column. The defective four columns can then be replaced by a set of four redundant columns.

As can be seen from the above description, the memory device 170 outputs a single bit of data or a tri-state condition for every four transitions of the clock CKINT. The four transitions equal the time utilized to receive the four packet words of the command packet COM. The single bit of data or tri-state condition is thus responsive to a single command packet COM and provides information about four memory locations.

The test head 110 identifies the error indicator by monitoring the output impedance of the tri-state output buffer 183. However, capacitance and inductance in the test head 110, cabling, and in the tri-state output buffer 83 limit the speed with which the output impedance of the tri-state output buffer 83 can be detected. As a result, the test head 110 and test circuitry 112 may have difficulty detecting an error at high operating speeds of the memory device 70. This problem is made even more difficult by the use of four register sets 79 triggered by the read latch signal LATCHR that allow transfer of data at each "tick" (i.e., rising or falling edge) of the external clock signal CKEXT. Because the 4 bits of data from the output data registers 79 are output over only two clock cycles, each of the 4 data bits will have approximately one-half of a clock cycle for the tri-state output buffer 183 to present data to the data bus 130.

If only one of the column lines is defective, the tri-state condition will be present for only one-half of a clock cycle, and the test head 110 may have very little time to identify the tri-state condition. In fact, this available time would actually be even less than a half clock cycle due to the switching time of the tri-state output buffer 183. Consequently, at very high speed operation, the testing system may incorrectly identify a tri-state output as a valid output.

To allow extra time for the test system to identify the tri-state output, the flag signal FLAG remains true for two complete cycles of the internal clock signal CKINT, which corresponds to reading of 64 bits (four sets of 16 bits) from the memory array 80. The tri-state buffer 183 thus produces the tristate output for two clock cycles of the data clock DCLK. The test head 110 can more easily identify the presence of the tri-state condition because the tri-state condition is present at the output of the driver 183 for two clock cycles, rather than only one-half clock cycle.

Figure 5:
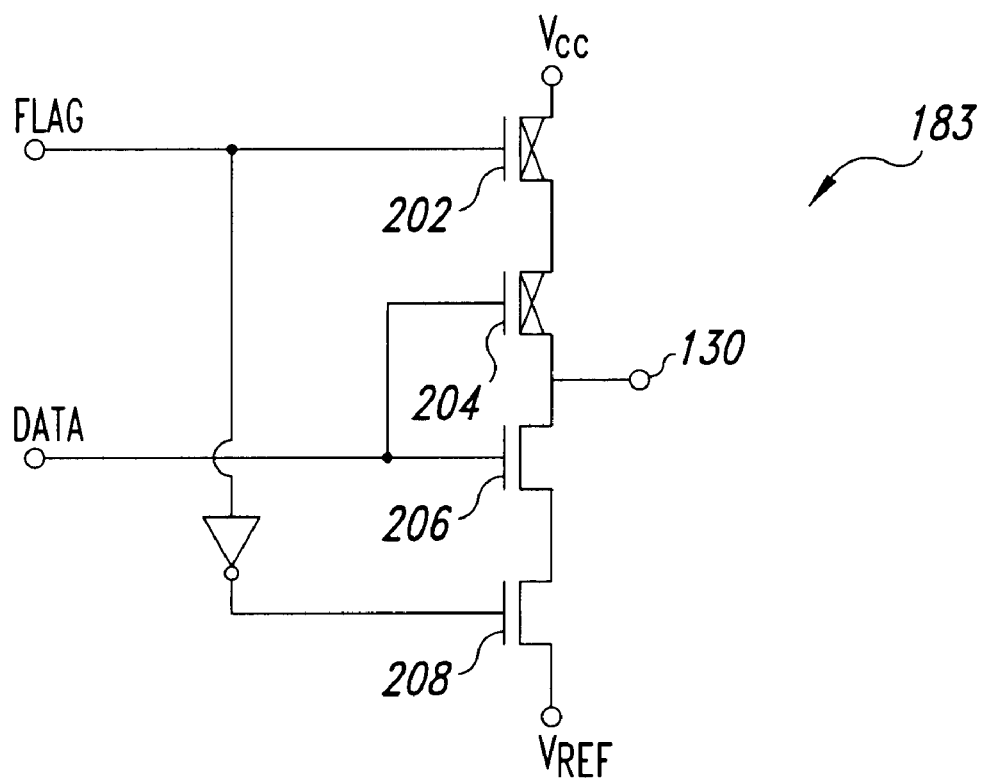
FIG. 5 is a schematic of one embodiment of an output driver for use in the output data path of FIG. 4.

FIG. 5 shows one circuit suitable for use as the tri-state output buffer 183. The tri-state output buffer 183 of FIG. 5 includes 4 transistors 202, 204, 206, 208 serially coupled between the supply voltage $V_{CC}$ and the reference voltage $V_{REF}$. The upper two transistors 202, 204, are PMOS transistors, while the lower two transistors 206, 208 are NMOS transistors. The uppermost and lowermost transistors 200, 202 receive the flag signal FLAG from the compare circuit 189. The middle two transistors 204, 206 are driven by the output of the register 179 and an inverted version of the register output, respectively. One skilled in the art will recognize that if the flag signal FLAG or test latch signal LATCHR-TST is high, the transistors 202, 208 will be OFF and the output of the tri-state buffer 183 will be an open circuit. If the latched flag signal FLAG is low, the transistors 202, 208 will be ON. The output voltage will then be controlled by the data from the registers 179. If one of the registers 179 outputs a high signal, the lower PMOS transistor 204 will be OFF and the upper NMOS transistor 206 will be ON. Consequently, the buffer output will equal the reference voltage $V_{REF}$. If the output from the register 179 is low, the lower PMOS transistor 204 will be ON and the upper NMOS transistor 206 will be OFF. Consequently, the output from the output buffer 183 will be the supply voltage $V_{CC}$.

Figure 6:
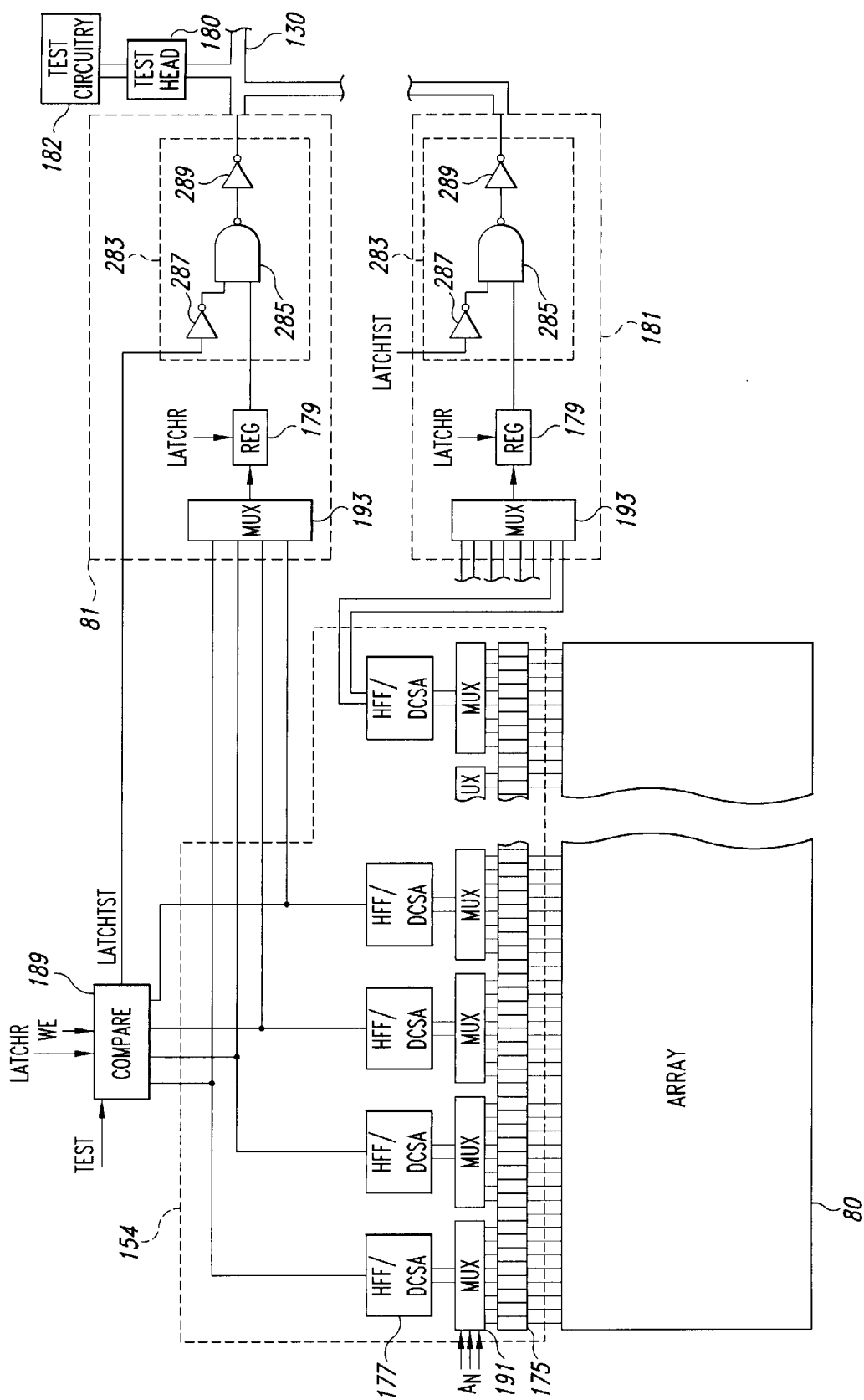
FIG. 6 is a schematic of an array I/O gating circuit, and output data path where a comparator is coupled to line drivers and a logic circuit combines the comparator and data.

FIG. 6 shows another embodiment of the output data path where the comparing circuit 189 compares output data directly from the line drivers 177. One skilled in the art will recognize that, unlike the embodiment of FIG. 4, a separate comparing circuit 189 will be coupled to every group of four line drivers 177, rather than to each set of registers 179.

The embodiment of FIG. 6 also differs from that of FIG. 4 by replacing the four output register stages with a single stage and by replacing the tri-state buffer 183 with a logic circuit 283. The single output register stage simplifies the structure of the register 179 and reduces the complexity of the data path. The logic circuit 283 provides logic level outputs of the register data or logic level outputs indicative of defective cells during testing, as will now be described.

At each pulse of the read signal LATCHR, the logic circuit 283 receives data from the single-stage register 179 at a NAND gate 285. The second input of the NAND gate 285 receives an inverted version of the compare signal LATCH-TST from an inverter 287. The output of the NAND gate 285 will thus be high whenever the output of the comparing circuit 189 is low or the data from the register 179 is low. The NAND gate 285 drives an inverter/buffer 289 that, in turn, drives the data bus 130. One skilled in the art will recognize that the logic circuit 283 will output a "0" when the compare signal LATCH-TST is high (indicating a data error) and will output the retrieved data when the compare signal LATCH-TST is low (indicating no data error). The array 80 can thus be tested by writing the array 80 corresponding to high voltages and monitoring the data bus 130 with the test head 180. If the output data are all "1," the data are valid. If the data are "0" the comparing circuit 189 has identified a defective group of data. Advantageously, if all four bits of data are "0," the register 179 will output a "0" and the output data will also be "0." Thus, when all four bits are defective, this embodiment can output an error indication even though the comparing circuit 189 may indicate a match. As with the embodiment of FIG. 4, the test data remain on the data bus 180 for four clock ticks, thereby providing time for the test head 180 to evaluate the data.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of testing a memory device including a memory array, comprising:
   writing data to the memory array in a predetermined pattern;
   reading data from the array;
   determining whether the read data are correct by comparing a plurality of the read data to a selected pattern;
   if the read data match the selected pattern, supplying output data to a data bus over an output interval; and
   if the read data do not match the selected pattern, providing an error indicator to the data bus during the output interval instead of providing the output data to the data bus.

2. The method of claim 1 wherein the memory device is a synchronous device responsive to a clock signal and wherein the step of supplying the output data over an output interval of the step of providing an error indicator to the data bus extends over a plurality of transitions of the clock signal.

3. The method of claim 2 wherein the number of transitions in the plurality of transitions of the clock signal equals the number of data bits in the plurality of read data that are compared to the selected pattern.

4. The method of claim 1, further including the step of storing the read data in respective registers and wherein the step of determining whether the read data are correct by comparing a plurality of the read data to a selected pattern includes comparing the stored data to the selected pattern.

5. The method of claim 1 wherein the error indicator is a tri-state output.

6. The method of claim 5, further including the step of producing an error indication with a test head in response to the tri-state output.

7. A method of transferring data from a memory array within a memory device to a data bus, comprising:
   reading a plurality of data from the memory array;
   determining, within the memory device, if any of the read data correspond to an error;
   if any of the read data correspond to an error, producing a flag signal having a first logic state indicating the presence of an error and a second logic state indicating the absence of an error;
   transferring the flag signal to an output driver circuit;
   if the flag signal has the second logic state, outputting the read data from the output driver circuit during an output interval; and
   if the flag signal has the first logic state producing an error indicator from the output driver circuit during the output interval.

8. The method of claim 7 wherein the step of transferring the signals corresponding to the read data includes sequentially providing the signals responsive to transitions of a clock signal, further including the step of sustaining the error indicator for a plurality of transitions of the clock signal.

9. The method of claim 7 wherein the step of producing an error indicator includes the step of producing a single error indicator corresponding to all of the bits in the group.

10. The method of claim 7 wherein the step of producing an error indicator includes producing a tri-state condition with the buffer.

11. The method of claim 7 wherein the step of determining if any of the read data correspond to an error includes the step of comparing the read data to a set of desired data.

12. A method of transferring data from a memory array to a data bus, comprising:
   segmenting the data from the array into groups, each group containing a plurality of bits;
   if any of the bits in a selected one of the groups corresponds to an error at the memory array, selectively blocking the selected group of data from the data bus; and
   if none of the bits in the selected one of the groups corresponds to an error at the memory array, transferring the group of data to the data bus.

13. The method of claim 12 wherein the memory device is a synchronous device responsive to a clock signal and wherein the step of selectively blocking the group of data from the data bus includes blocking the group for a plurality of clock cycles.

14. The method of claim 12, further including reading the data from the array at a plurality of clock ticks.

15. The method of claim 14 wherein the step of separating the data into groups includes segmenting data from a plurality of clock ticks into each group.

16. The method of claim 15 wherein the step of blocking signals from the data bus includes blocking the signals for more than one clock tick.

17. The method of claim 13 wherein the step of determining if any of the read data correspond to an error includes the step of comparing the read data to a set of desired data.

18. The method of claim 12 wherein the step of supplying the group of data to the data bus includes sequentially providing the data in the group of data to an output driver.

19. The method of claim 12, further including the step of comparing the stored data to a selected bit pattern to determine if one of the bits in the read data corresponds to an error.

20. The method of claim 19 wherein transferring the group of data to the data bus includes inputting the stored data to an output driver.

21. The method of claim 20 wherein the step of blocking the group of data from the data bus includes the step of, if the data in the registers does not match the selected bit pattern, producing an error signal indicating that the read data are in error and wherein the step of selectively blocking the selected group of data from the data bus includes applying the error signal to the output driver to override the selected group of data bits.

22. The method of claim 21 wherein the step of applying the error signal to the output driver includes blocking a plurality of bits in the selected group of data.

23. The method of claim 22 wherein the step of applying the error bit includes blocking the entire selected group of data from the data bus.

24. A method of testing a memory device responsive to a clock signal, the memory device including a memory array comprising the steps of:
   writing data to the memory array in a predetermined pattern;
   after writing data to the memory array issuing a read command on a first clock transition;
   at a second clock transition and responsive to the read command reading data from the memory array;
   within the memory device comparing the data read from the memory array to the predetermined pattern;
   producing an output signal responsive to the step of comparing the data read from the memory array to the predetermined pattern; and
   at a plurality of clock transitions outputting the output signal from the memory device.

25. The method of claim 24 wherein the step of producing an output signal includes the steps of:
   if the data read from the memory array match the predetermined pattern, outputting data corresponding to the read data; and
   if the data read from the memory array does not match the predetermined pattern, outputting an error indicator.

26. The method of claim 25 wherein the step of outputting an error indicator includes producing an open circuit output signal.

27. A memory device, comprising:
   an output driver circuit having a data output terminal adapted for coupling to a data bus, an error input terminal and a data input terminal, the output driver circuit being operative to produce a tri-state output signal in response to an error signal at the error input terminal;
   a memory array arranged in rows and columns;
   an I/O interface coupled to the array, the I/O interface being configured to read data from a plurality of memory cells within the memory array, the I/O interface including a plurality of output terminals;
   a data path coupled between the I/O interface and the output driver circuit; and
   a comparing circuit having an input coupled to the data path and an error output terminal coupled to the error input terminal, the comparing circuit being responsive to compare data on the data path to a selected set of data and to produce the error signal at the error output terminal in response to the data on the data path not matching the selected set of data.

28. The memory device of claim 27, further comprising a multiplexer coupled between the I/O interface and the data path.

29. The memory device of claim 27, further comprising a plurality of data registers coupled between each of the data paths and the output driver circuit.

30. The memory device of claim 29 wherein the data registers are serially coupled.

31. The memory device of claim 29, further comprising a multiplexer coupled between a first plurality of the data paths and a first of the registers.

32. A test system including:
   a data bus;
   a memory device including:
      an output driver circuit having a data output terminal coupled to the data bus, an error input terminal and a data input terminal, the output driver circuit being operative to produce a tri-state output signal at the data output terminal in response to an error signal at the error input terminal;
      a memory array arranged in rows and columns;
      an I/O interface coupled to the array, the I/O interface being configured to read data from a plurality of memory cells within the memory array, the I/O interface including a plurality of output terminals;
      a data path coupled between the I/O interface and the output driver circuit; and
      a comparing circuit having an input coupled to the data path and an error output terminal coupled to the error input terminal, the comparing circuit being responsive to compare data on the data path to a selected set of data and to produce the error signal at the error output terminal in response to the data on the data path not matching the selected set of data;
   a test head adapted for coupling to the output driver circuit, the test head being responsive to detect the tri-state condition; and
   testing circuitry coupled to the test head.

33. The test system of claim 32 wherein the memory device further comprises a multiplexer coupled between the I/O interface and the data paths.

34. The test system of claim 32 wherein the memory device further comprises a plurality of data registers coupled between each of the data paths and the output driver circuit.

35. The test system of claim 34 wherein the data registers are serially coupled.

36. The test system of claim 32 wherein the comparing circuit is configured to compare a plurality of read data to a select pattern of read data to identify the error condition.

* * * * *

UNITED STATES PATENT AND TRADEMARK OFFICE
CERTIFICATE OF CORRECTION

PATENT NO. : 5,935,263
DATED : August 10, 1999
INVENTOR(S) : Keeth et al.

It is certified that error appears in the above-identified patent and that said Letters Patent is hereby corrected as shown below:

Column 2, line 48      "16a-care"                            -- 16a-c are --

Signed and Sealed this

Seventeenth Day of April, 2001

Attest:

NICHOLAS P. GODICI

*Attesting Officer*      *Acting Director of the United States Patent and Trademark Office*